United States Patent [19]

Deluca et al.

[11] Patent Number: 5,285,007
[45] Date of Patent: Feb. 8, 1994

[54] SYSTEM FOR REDUCING THE EMISSION OF HIGH FREQUENCY ELECTROMAGNETIC WAVES FROM COMPUTER SYSTEMS

[75] Inventors: Alfred E. Deluca, Harvard; Jeffrey M. Lewis, Maynard; Cosmo L. Leo, Watertown; Thomas J. Orr, Sudbury; David T. Symmes, Danvers; Robert A. Barker, Lunenburg, all of Mass.

[73] Assignee: Digital Equipment Corporation, Maynard, Mass.

[21] Appl. No.: 829,649

[22] Filed: Feb. 3, 1992

[51] Int. Cl.⁵ ............................................. H05K 9/00
[52] U.S. Cl. ..................................... 174/35 R; 361/818
[58] Field of Search ................ 174/35 R, 35 MS, 50, 174/52.1, 52.2, 52.3, 52.4, 262; 361/302, 306, 307, 390, 394, 395, 424

[56] References Cited

U.S. PATENT DOCUMENTS

| | | | |
|---|---|---|---|
| 4,658,334 | 4/1987 | McSparran et al. | 361/415 |
| 4,698,605 | 10/1987 | Imamura et al. | 333/184 |
| 4,823,103 | 4/1989 | Nakagawa et al. | 336/175 |

Primary Examiner—Leo P. Picard
Assistant Examiner—Bot Ledynh
Attorney, Agent, or Firm—Kenyon & Kenyon

[57] ABSTRACT

A containment system for significantly reducing the emission of high frequency electromagnetic waves from a computer system into the external environment. The containment system includes the combination of two enclosures and a shielding assembly. One of the enclosures is associated with the high frequency components and the other with the low frequency components of the computer system. The shielding assembly is positioned between the two enclosures to prevent high frequency electromagnetic waves from passing from one chamber to the other over the connection between the two chambers.

20 Claims, 3 Drawing Sheets

SYSTEM FOR REDUCING THE EMISSION OF HIGH FREQUENCY ELECTROMAGNETIC WAVES FROM COMPUTER SYSTEMS

FIELD OF THE INVENTION

The present invention relates to systems that reduce the amount of high frequency electromagnetic waves that a computer system emits to the external environment.

BACKGROUND OF THE INVENTION

It is known that certain computer system components emit electromagnetic waves, and in particular radio frequency ("RF") waves, at relatively low frequency, for example, at about 1 GHz. The emission of these low frequency electromagnetic waves has not been of great concern. However, some computer system components emit high frequency electromagnetic waves which if allowed to escape to the external environment would be of concern. This concern is that the escaping high frequency electromagnetic waves could cause interference, for example, with electronic systems that have equipment that operate in that frequency range.

As an example, a computer system may have a CPU module in its cardcage portion. The CPU may emit high frequency electromagnetic waves in the 5 GHz range. The CPU may be connected to a storage device that emits low frequency electromagnetic waves in the 1 Ghz range. Even though the computer system enclosure generally shields against the emission of high frequency electromagnetic waves to the external environment, the high frequency electromagnetic waves can possibly escape through connections between the CPU and storage device, and ultimately through openings in the computer system to the external environment which permit access to the storage device, such as an opening for a removable media storage device of which a tape drive is representative.

It is desirable to have a system that prevents the emission of high frequency electromagnetic waves to the external environment by means of connections of computer system components and openings in the computer system enclosures.

The present invention solves these and other problems as set forth in the remainder of the specification and as shown in the accompanying drawings.

SUMMARY OF THE INVENTION

The present invention provides a system for significantly reducing the emission of high frequency electromagnetic waves from a computer system into the external environment.

The system of the present invention has two enclosures (or chambers) and a shielding assembly. In general, one of the enclosures is associated with the high frequency components and the other with the low frequency components of the computer system. The enclosure containing the low frequency components may have openings to the external environment. The shielding assembly, which is positioned between the two enclosures, includes ferrite, blocks for filtering the high frequency electromagnetic emissions from the first enclosure containing the high frequency components that are associated with the electrical connections between the enclosures from reaching the second enclosure containing the low frequency components. The two enclosures and shielding assembly when combined form the containment system of the present invention.

As a result, the likelihood of the high frequency waves escaping uncontrollably to the external environment through openings used for accessing components in the second enclosure is significantly reduced.

Therefore, the containment system of the present invention effectively reduces the emission of high frequency electromagnetic waves from the computer system to the external environment.

These and other features of the present invention will be described in detail in the remainder of the specification referring to the drawings.

DETAILED DESCRIPTION OF THE INVENTION

The present invention is a system for reducing the emission of high frequency electromagnetic waves from a computer system into the external environment.

The present invention includes a first enclosure member for enclosing components that emit high frequency electromagnetic waves and a second enclosure member for enclosing components that emit low frequency electromagnetic waves. The second enclosure may be configured to include openings to the external environment. These two enclosure members are coupled by a shielding assembly. The first enclosure member will be described referring to FIG. 1, the second enclosure member referring to FIG. 2, and the shielding assembly referring to FIG. 3. The system of the present invention including the first and second enclosure members, and the shielding assembly that couples the two enclosure members will be described referring to FIG. 4.

Figure 1:
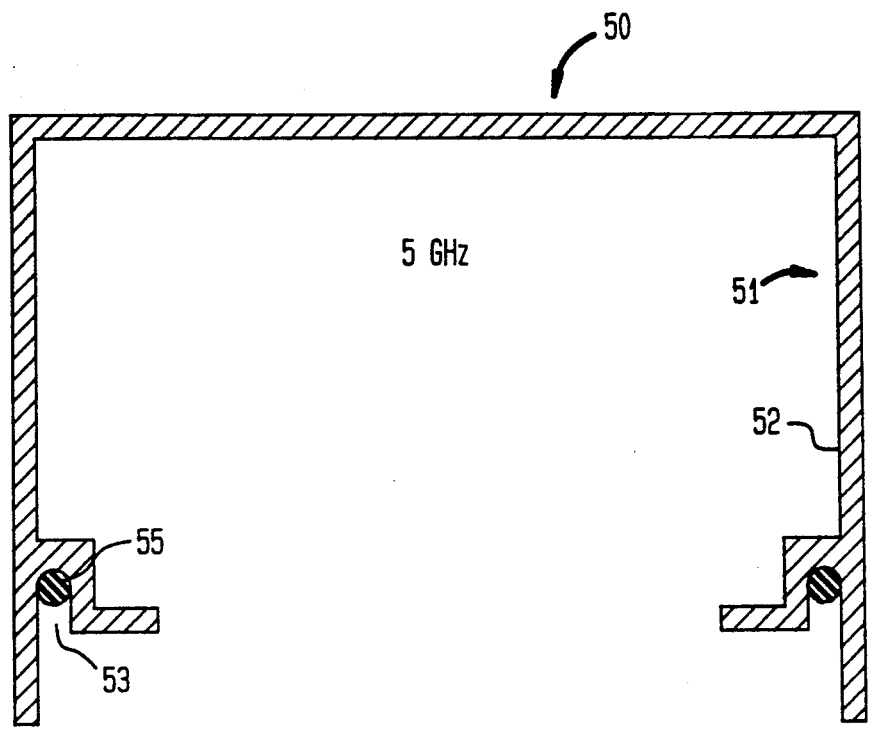
FIG. 1 is a side cross-sectioned view of a representative chamber of the present invention for containing, for example, high frequency components.

FIG. 1, generally at 50, shows a representative enclosure member for disposition of high frequency components of a computer system. When operating, these components emit high frequency electromagnetic waves, for example, RF waves in the 5 Ghz range. Chamber 51 has conductive walls 52 which will sufficiently contain emissions in the 5 Ghz range. The enclosure member has "U" shaped trough 53 with gasket material 55 disposed in it. This "U" shaped trough and gasket material are used in assembling the system of the present invention. Preferably, the gasket material is a beryllium copper mesh commercially available from Instrument Specialties Co., Delaware Water Gap, Pa.

Figure 2:
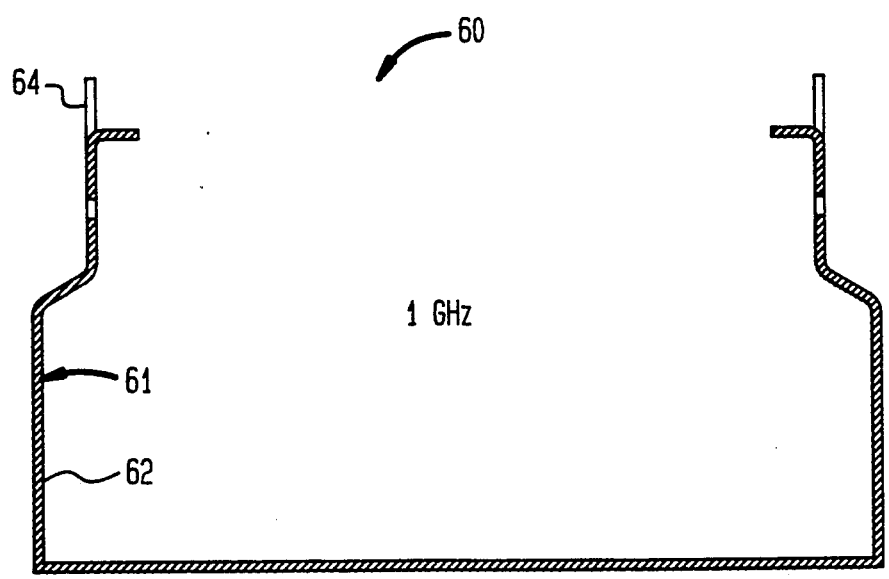
FIG. 2 is a side cross-sectioned view of a representative chamber of the present invention for containing, for example, low frequency components.

FIG. 2, generally at 60, shows a representative enclosure member for disposition of low frequency components. Chamber 61 has conductive walls 62 which will sufficiently contain the low frequency electromagnetic waves at about 1 Ghz. The chamber has end 64 that is used in assembling the system of the present invention. Although not shown, this chamber may have openings in the walls to accommodate access to removable media storage devices, such as tape drives, which reside in the chamber.

Figure 3:
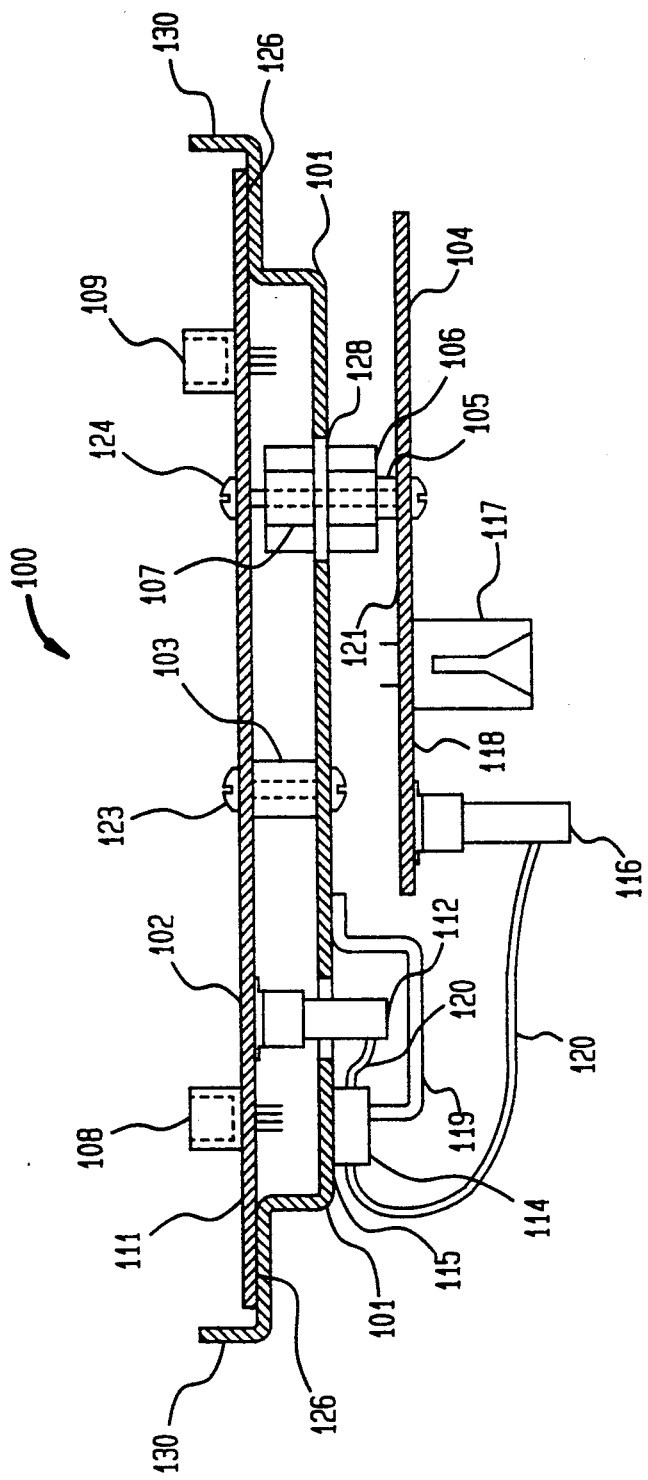
FIG. 3 is a side cross-sectioned view of a shielding assembly of the present invention used to form separate chambers that contain components that emit electromagnetic waves in two different frequency ranges.

Referring to FIG. 3, the shielding assembly of the present invention is shown generally at 100. This shielding assembly includes metal shield 101, first backplane 102, second backplane 104, and filters 106 and 114. Backplanes 102 and 104 are conventional backplanes. The interconnection of these elements will now be described.

Conductive metal shield 101 at 126 contacts and supports first backplane 102 along its edges. Conductive metal shield 101 also connects to first backplane 102 via conductive metal standoffs 103. Standoffs 103 maintain a predetermined distance between center portions of the metal shield and first backplane, and prevent the first backplane from flexing.

Fastening member 123 is disposed through the metal shield, standoff, and first backplane. Fastening member 123, which preferably is a conductive metal screw, keeps the metal shield and first backplane in a fixed, spaced relationship. Only one standoff 103 is shown in FIG. 3, however, it is to be understood that there are a number of standoffs 103 disposed between metal shield 101 and first backplane 102 and each has a fastening member through it.

First backplane 102 is also coupled to second backplane 104. This connection is by means of conductive metal power/ground standoffs 105 and fastening members 124. Preferably, each fastening member 124 is a conductive metal screw. Standoffs 105 maintain a predetermined distance between first backplane 102 and second backplane 104. Like standoffs 103, only one standoff is shown in FIG. 3, but it is to be understood that there are a number of standoffs 105 disposed between first backplane 102 and second backplane 104. Each of this plurality of standoffs 105 passes through an opening in metal shield 101.

A ferrite block 106 is positioned about each of the plurality of standoffs 105 where each such standoff passes through an opening 128 in metal shield 101. As stated, each of the plurality of ferrite blocks 106 is positioned about a standoff 105 where that standoff passes through the metal shield, but each ferrite block does not contact the metal shield. It is also contemplated that a piece of non-conductive material, such as a piece of foam, may be positioned between the respective ends of ferrite block 106 and the first backplane 102 and second backplane 104 to keep the ferrite block 106 in the proper position.

First surface 111 of first backplane 102 has card connectors 108 and 109 fixed to it. These card connectors may be connected to separate cards. Second surface 113 of first backplane 102 has a connector 112 fixed to it. Connector 112 extends through an opening in metal shield 101. Metal shield 101, while close to connector 112, does not contact it. Second conductive metal shield 119, which is an extension of metal shield 101 and, therefore, connects to it, encloses the portion of connector 112 that extends through metal shield 101.

Ferrite block 114 is disposed in the wall of second conductive metal shield 119. As shown in FIG. 3, line 120 connects connector 112 and connector 116, which is disposed at surface 118 of second backplane 104. There may be a number of lines 120 extending through ferrite block 114 even though only one line 120 is shown in FIG. 3. Each signal line 120 is actually a connection from connector 108 to connector 117 which is through electrical paths in first backplane 102, connector 112, ferrite block 114, connector 116, and electrical paths in second backplane 104. A similar type connection network exists for connector 109 to connect to a connection such as connector 117 or another type of connector in the other chamber. First and second backplanes 102 and 104, respectively, may be constructed having a plurality of layers.

Each power/ground standoff extends a predetermined distance into first backplane 102 at surface 113 and a predetermined distance into second backplane 104 at surface 121. As such, the power/ground standoffs are intended to access predetermined layers of the backplanes in order to electrically connect corresponding layers of the first and second backplanes. For example, a ground standoff extends from a predetermined layer in first backplane 102 which is intended to be at ground voltage to a predetermined layer of second backplane 104 which also is intended to be at ground voltage. This ensures that both backplanes have the same ground voltage. Similarly, a power standoff connects a predetermined layer of the first backplane which is at a certain voltage level to the corresponding layer of the second backplane which also is intended to be at that voltage level. Moreover, each power/ground standoff 105 of the system is intended to electrically connect two different corresponding layers of the first and second backplanes. Ferrite block 106 that is disposed about each power/ground standoff filters the electromagnetic waves associated with the chamber of origin.

Figure 4:
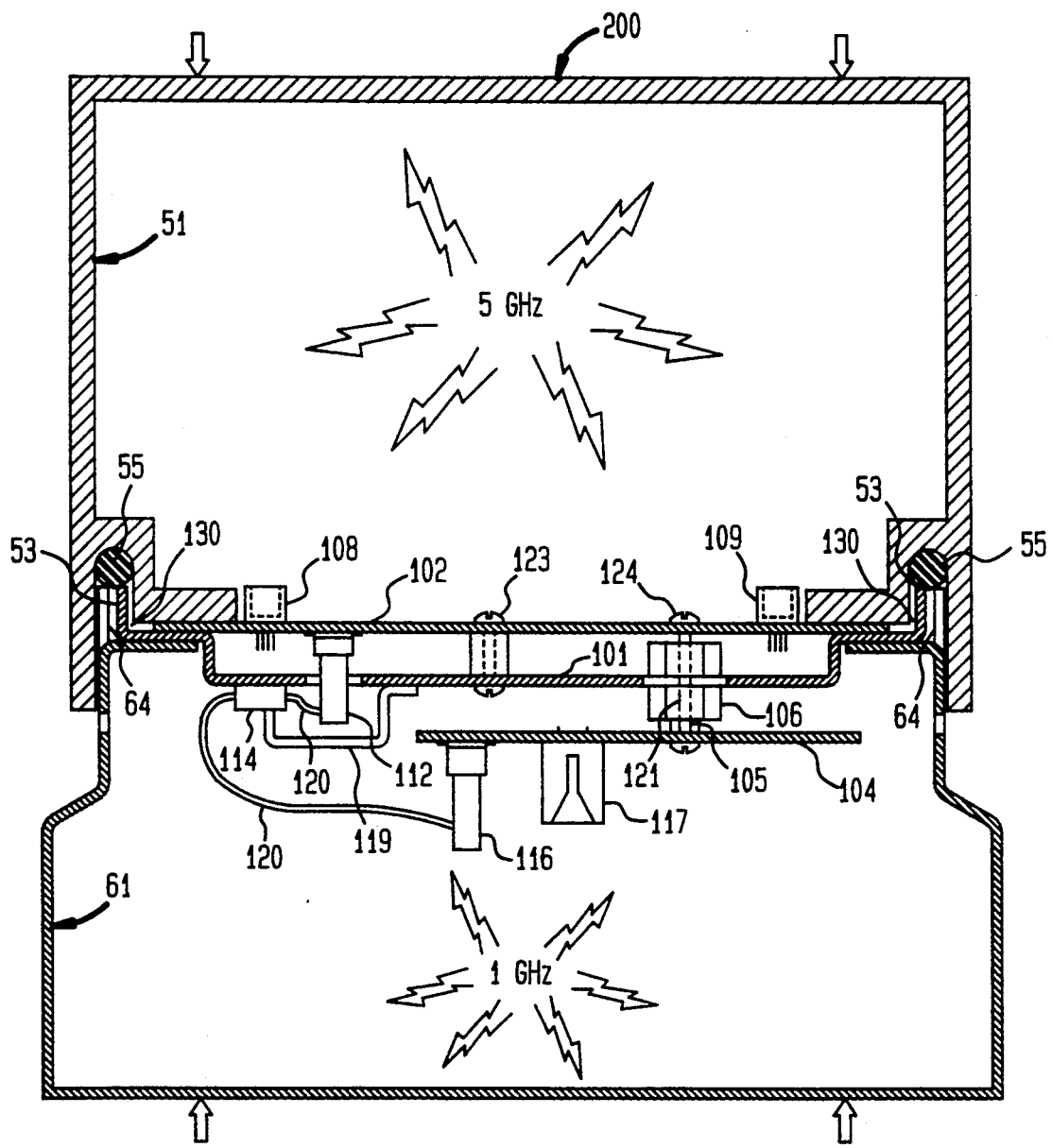
FIG. 4 is a side cross-sectioned view of the system of the present invention fully assembled.

FIG. 4, generally at 200, shows the system of the present invention assembled. In assembling the system of the present invention, end 130 of metal shield 101 and end 64 of second chamber 61 are fixed with a conductive gasket 55 in "U" shaped trough 53 of first chamber 51. When the system of the present invention is assembled, the only accesses between the chambers are the electrical connections via lines 120 through ferrite block 114 and power/ground standoffs 105 through ferrite block 106.

Given the configuration in FIG. 4, metal shield 101 acts as a barrier between chambers 51 and 61 to prevent high frequency electromagnetic waves emitted by the components in chamber 51 from escaping into chamber 61, and possibly into the external environment through openings in chamber 61. In particular, ferrite blocks 106 and 114 filter the high frequency electromagnetic waves associated with standoff 105 and line 120, respectively. The ferrite blocks prevent the high frequency electromagnetic waves in chamber 51 from entering chamber 61 over the connections between the two chambers: standoff 105 and line 120.

As an example of a system using the present invention (which is not meant to limit the present invention in any way), a circuit card in chamber 51 is electrically connected to a card connector such as 108 or 109. Card connector 108 connects to connector 112 through backplane 102. The card may include components that emit high frequency electromagnetic waves at about 5 Ghz. A storage device is contained in chamber 61 and is electrically connected to storage connector 117. Storage connector 117 connects to connector 116 through backplane 104. The storage device is a component that emits low frequency electromagnetic waves in the 1 Ghz range. It is understood that signals are exchanged between the two components. These signals may be transferred between the card and the storage device on lines 120. Each line 120 extends through ferrite block 114. The ferrite block filters any electromagnetic emissions associated with each line 120 in the chamber of origin. More specifically, ferrite block 114 filters the signals on line 120 by absorbing the emissions associated with each line 120; thereby substantially preventing high frequency electromagnetic waves from reaching chamber 61.

Ferrite block 106 serves the same purpose for power/ground standoffs 105 as ferrite block 114 serves for line 120. That is, it filters the electromagnetic emissions associated with power or ground signals being transmitted through power/ground standoffs 105. Hence, the emissions associated with the power/ground standoffs are prevented from reaching the other chamber.

The terms and expressions which are employed herein are used as terms of expression and not of limitation. And, there is no intention, in the use of such terms and expressions, of excluding the equivalents of the features shown, and described, or portions thereof, it being recognized that various modifications are possible within the scope of the invention.

What is claimed is:

1. A containment system for reducing the emission of electromagnetic waves at predetermined frequencies, comprising:
   a first electrical device emitting electromagnetic waves in a first frequency range;
   a second electrical device emitting electromagnetic waves in a second frequency range, the second frequency range being lower than the first frequency range;
   a first enclosure containing the first electrical device and the electromagnetic waves emitted therefrom;
   a second enclosure containing the second electrical device and the electromagnetic waves emitted therefrom and reducing the emission of electromagnetic waves in the first frequency range from the containment system; and
   a shield assembly disposed between the two enclosures to form with the first enclosure a first chamber containing the first device and with the second enclosure a second chamber containing the second device, the shield assembly having:
   i. an electrical connection for connecting the electrical device in the first chamber to the electrical device in the second chamber, and
   ii. means for filtering electromagnetic emissions associated with the electrical connection between the first and second chambers to reduce the emission of electromagnetic waves from the first chamber into the second chamber.

2. The system as recited in claim 1, wherein the first electrical device emits high frequency electromagnetic waves.

3. The system as recited in claim 1, wherein the second electrical device emits low frequency electromagnetic waves.

4. The system as recited in claim 1, wherein the filtering means includes ferrite blocks.

5. The system as recited in claim 1, wherein the shield assembly further comprises:
   a first backplane;
   a second backplane; and
   a conductive metal shield disposed between, and associated with, the first and second backplanes.

6. The system as recited in claim 1, wherein the second chamber has an opening for accessing the second electrical device.

7. The system as recited in claim 6, wherein the second electrical device is a removable media storage device.

8. In a system including a first electrical device that emits electromagnetic waves in a first frequency range, and a second electrical device that emits electromagnetic waves in a second frequency range which is lower than the first frequency range, an electromagnetic wave containment assembly comprising:
   a first enclosure member for containing the first electrical device and the electromagnetic waves generated therefrom,
   a second enclosure member for containing the second electrical device and the electromagnetic waves generated therefrom, and for reducing the emission of electromagnetic waves emitted by the first device from the containment assembly;
   a shield member disposed between the first and second enclosure members to form a first chamber containing the first electrical device and a second chamber containing the second electrical device and for reducing the emissions of electromagnetic waves emitted by the first electrical device into the second chamber; and
   filtering means for filtering electromagnetic waves associated with electrical connections between the two chambers through the shield member.

9. The system as recited in claim 8, wherein the filtering means includes a ferrite member disposed about each electrical connection between the two chambers.

10. The system as recited in claim 8, wherein the shield assembly further comprises a first backplane associated with the shield member.

11. The system as recited in claim 10, wherein the shield assembly further comprises a second backplane associated with the shield member.

12. The system as recited in claim 11, wherein the electrical connections between the two chambers are between the first backplane and the second backplane.

13. The system as recited in claim 12, wherein the electrical connections extend from a first connector in the first chamber to a second connector in the second chamber.

14. The system as recited in claim 8, wherein the first chamber includes components that emit high frequency electromagnetic waves.

15. The system as recited in claim 14, wherein the electromagnetic waves emitted by the components in the first chamber are in the 5 Ghz range.

16. The system as recited in claim 8, wherein the second chamber includes components that emit low frequency electromagnetic waves.

17. The system as recited in claim 16, wherein the electromagnetic waves emitted by the components in the second chamber are in the 1 Ghz range.

18. The system as recited in claim 8, wherein the shield member includes a conductive metal shield.

19. The system as recited in claim 8, wherein the second chamber has an opening for accessing the second electrical device.

20. The system as recited in claim 19, wherein the second electrical device is a removable media storage device.

* * * * *